ULTRASONIC AMPLIFIER DEVICE WITH MEANS FOR PREVENTING SELF-OSCILLATION

Filed Aug. 4, 1967

WITNESSES:

Leon M. Garman

James F. Young

INVENTOR

William E. Newell

BY Gordon H. Telfer

ATTORNEY

United States Patent Office 3,389,343

Patented June 18, 1968

3,389,343

ULTRASONIC AMPLIFIER DEVICE WITH MEANS FOR PREVENTING SELF-OSCILLATION

William E. Newell, Murrysville, Pa., assignor to Westinghouse Electric Corporation, Pittsburgh, Pa., a corporation of Pennsylvania Filed Aug. 4, 1967, Ser. No. 658,392

5 Claims. (Cl. 330—5.5)

ABSTRACT OF THE DISCLOSURE

An ultrasonic amplifier is described utilizing a main body of piezoelectric semiconductor material wherein an additional body of such material is disposed adjacent the output transducer and opposite the main body of material providing the amplifier. The additional body of material has a good acoustic match with the amplifier and output transducer and also provides large attenuation. The attenuation may be provided by having the end surface of the body roughened or cut at an angle to prevent coherent reflection of the amplified acoustic wave. Alternatively, a different drift field may be applied across the backing body than that across the main amplifier body to provide attenuation.

*Background of the invention*

*Field of the invention.*—This invention relates generally to ultrasonic amplifier devices comprising a piezoelectric semiconductor material wherein ultrasonic waves can be amplified by interacting with carriers whose drift velocity is greater than the velocity of the acoustic wave.

*Description of the prior art*

Description of the general type of ultrasonic amplifier device to which this invention relates and examples of prior art configuration is contained in, for example, an article by Hutson, McFee, and White in Physical Review Letters, volume 7, pages 237–239, Sept. 15, 1961, in an article by White in Journal of Applied Physics, volume 33, pages 2547–2554, August 1962, and in White Patent 3,173,100, issued Mar. 9, 1965, which should be referred to for further information.

In such devices the amplification process is roughly analogous to that in a conventional traveling wave tube. As in any traveling wave structure in which there is a signal gain, it is necessary to prevent the forward wave from being reflected back to the input with sufficient amplitude to cause oscillation. Prior art ultrasonic amplifiers have avoided or attempted to avoid this problem by using pulsed signals.

Among the objects of the present invention are to provide effective, yet simple to implement, means for insuring against self-oscillation in an ultrasonic amplifier.

*Summary of the invention*

In accordance with this invention means are provided to terminate the output of the traveling wave structure so that there is insufficient reflected wave to produce oscillation. In one form, a body of piezoelectric semiconductor material is provided adjacent the output transducer opposite the amplifier element matching in impedance the body of the amplifier element itself but having a terminating surface of such configuration as to avoid reflection of a coherent wave. Such a surface may be provided by roughening or angling the final surface of the structure. In another form such a body of piezoelectric semiconductor material is provided to which is applied a drift field differing in value from that applied to the amplifier.

*Description of the preferred embodiments*

Figure 1:
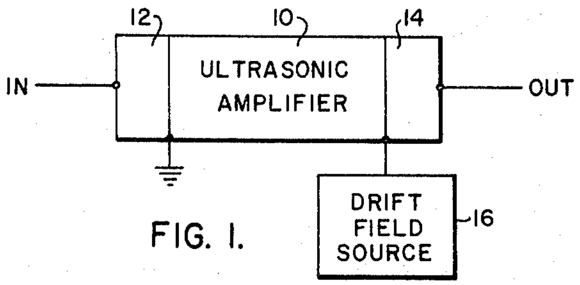
FIGURE 1 is a schematic view of an ultrasonic amplifier in a configuration in accordance with the prior art.

FIGURE 1 shows the basic physical arrangement employed in accordance with the prior art for the amplification of ultrasonic waves utilizing a piezoelectric semiconductor body 10. The semiconductor body 10 is of a material such as cadmium sulfide, although other II–VI compounds and also III–V compounds, as further examples, may also be used.

An input transducer 12 converts an applied electrical input signal into an appropriate type of ultrasonic wave that is coupled into the semiconductor 10, possibly through the use of a passive buffer element, not illustrated.

An output transducer 14 is provided at the other end of the semiconductor 10 for reconverting the amplified ultrasonic wave into an electrical signal. Suitable electrical contacts are provided on the elements for application of the input and output signals and also for the application of a drift field means of drift field source 16 across the semiconductor body.

The present invention uses the same essential arrangement as illustrated in FIG. 1 but differs in the disposition of means opposite semiconductor 10 at the output transducer 14 for attenuation of the applied wave.

The output transducer, while not described in detail herein, may be of the known depletion layer types or diffusion layer types as described in, for example, an article by White in IRE Transactions on Ultrasonics Engineering, volume UE–9, pages 21–27, July 1962 and an article by Foster in Journal of Applied Physics, volume 34, pages 990–991, April 1963. These transducer types are employed directly in the body of piezoelectric semiconductor 10. Other known types of transducers include that described in copending application Ser. No. 633,275, filed Apr. 24, 1967, by the present inventor and assigned to the assignee of the present invention. Additional known types of transducers may employ material not the same as that of the piezoelectric semiconductor but having substantially the same acoustic impedance.

It can be shown that in instances in which the transducer is of the same material or of a material having the same acoustic impedance as the piezoelectric semiconductor 10 that very little of the forward wave is reflected at the inner face between the transducer 14 and the amplifier body 10. Therefore the wave proceeds to the rear surface of the transducer element where ordinarily considerable coherent reflection will occur.

Figure 2:
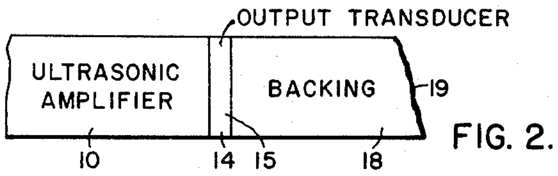
FIG. 2 is a partial view of an ultrasonic amplifier in accordance with one embodiment of this invention.

In accordance with this invention, as shown in FIG. 2, a body 18 of piezoelectric semiconductor material, either the same or one having substantially the same acoustic impedance as the body 10 of the amplifier, is provided at the rear surface of the output transducer and has means to strongly attenuate the acoustic wave as by having an angled or roughened, or both, surface 19 as illustrated that prevents the reflection of a coherent wave. It is sufficient that the surface 19 be nonparallel with the back surface 15 of the output transducer 14 as by departure from parallelism of greater than the acoustic wavelength of the wave.

Another means for providing attenuation in the body 18 of backing material is by providing a drift field across the body of backing material of different value than that across the amplifier body 10.

Figure 3:
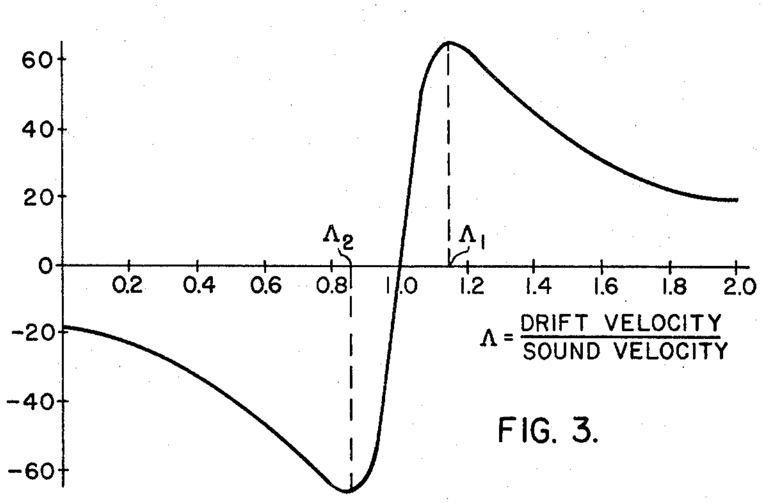
FIG. 3 is a graph showing variation of gain as affected by changes in drift field in an ultrasonic amplifier.

The function of the additional drift field may be explained by considering the fundamentals of ultrasonic amplifiers. The small signal gain of an ultrasonic amplifier in which only the electrons are mobile is given by:

$$G=4.34\frac{\omega}{V_s}\cdot\frac{e^2}{C\epsilon}\cdot\frac{(\Lambda-1)\frac{\sigma}{\omega\epsilon}}{(\Lambda-1)^2+\left(\frac{\sigma}{\omega}+\frac{D\omega}{V_s^2}\right)^2}$$

db per unit length where:

$\omega$=angular signal frequency
$V_s$=velocity of sound
$e$=piezoelectric constant
$\epsilon$=dielectric constant
$\Lambda$=ratio of drift velocity to velocity of sound
$\sigma$=conductivity
$D$=diffusion constant A variation of the gain of 50 megahertz shear waves in 45,000 ohm-centimeter cadmium sulfide with drift field is shown in FIG. 3 of the drawing. An amplifier is normally operated at the drift field corresponding to maximum gain, that is, where $\Lambda$ equals about 1.15 in this example.

Figure 4:
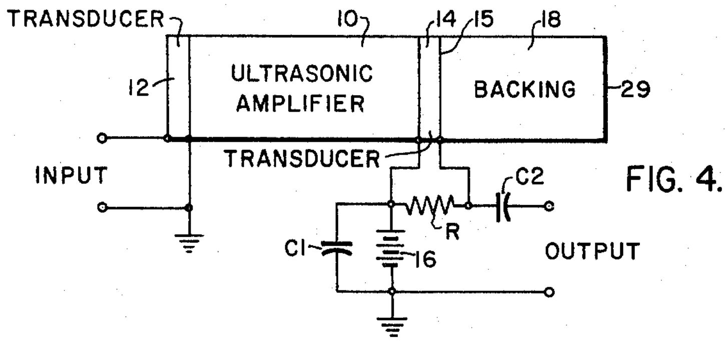
FIG. 4 is a further embodiment of the present invention.

Now referring to FIGURE 4, if a body of backing material 18 is provided and operated with a drift field corresponding to that at which there is a maximum attenuation, where $\Lambda$ equals about 0.85 in this example, the ultrasonic wave is rapidly attenuated in the backing body 18 thereby eliminating the reflected wave. In this type of embodiment the back surface 29 may be parallel with surface 15.

The polarity of the drift field in the backing body is not of importance since the attenuation can take place before or after the wave reflects from the rear surface.

FIGURE 4 illustrates one example of a circuit that may be used for obtaining both the amplifying and attenuating drift fields from a single supply. Naturally other configurations may be employed using additional supplies. The single D.C. supply 16 is connected directly across the body 10 of piezoelectric material of the ultrasonic amplifier. A capacitor C1 is connected across the drift field source 16 to provide a low impedance path for the signal and a high impedance path for direct current. Resistor R provides a load across which the output signal is developed. The output signal is derived through blocking capacitor C2 that blocks direct current from appearing at the output.

The foregoing embodiments involving the use of a body of material like that of the amplifier may be readily practiced in accordance with existing known materials and techniques. It is also possible to employ a different means for avoiding reflected waves in the ultrasonic amplifier without the backing body 18 next to the output transducer. Using a material that has electron and hole mobilities that are nearly the same, but in the same ratio as the drift fields required for maximum and minimum gain (FIG. 3), it is possible to build an amplifier with large gain and great stability. In such case the drift field will cause carriers of one type, for example electrons to move in one direction and holes in the opposite direction. The drift velocities of the electrons and holes will, of course, be proportional to their respective mobilities. If the polarity of the drift field is such that the electrons drift from the input toward the output, there can be close coupling between the electrons and the forward wave but relatively little coupling with the reflected wave. Conversely there can be close coupling between the holes and the reflected wave but relatively little coupling with the forward wave. The drift field may be supplied of a value to have an electron drift velocity corresponding to the maximum gain point as illustrated in FIGURE 3 while the drift velocity of the holes could correspond to the minimum gain point to minimize the reflected wave.

While the invention has been shown and described in a few forms only, it will be apparent that various changes and modifications may be made.

I claim:

1. An ultrasonic device comprising: a first piezoelectric semiconductive body; first transducer means for propagating an ultrasonic wave through said body in a first direction; second transducer means for converting said ultrasonic wave into an electrical signal; means for impressing a direct current voltage across said body in a direction parallel to said ultrasonic wave propagation; and means for preventing transmission of reflected elements of said ultrasonic wave opposite to said first direction, said means for preventing transmission of reflected elements of said ultrasonic wave comprises a second body of piezoelectric semiconductive material disposed adjacent said second transducer means opposite said first body.

2. The subject matter of claim 1 wherein: said means for preventing transmission of reflected elements comprises a rear surface of said body remote from said first body having a configuration that is non-parallel as compared with a back surface of said first body.

3. The subject matter of claim 1 wherein: said second body has the same acoustic impedance as said first body.

4. The subject matter of claim 3 wherein: said second body is of the same material as said first body.

5. The subject matter of claim 1 wherein: a drift field is supplied across said second body of a different value than that provided across said first body.

References Cited

UNITED STATES PATENTS 3,234,482 2/1966 Rowen et al. -------- 330—5.5

OTHER REFERENCES

Vural: RCA TN No. 648, November 1965.

ROY LAKE, *Primary Examiner.*

DARWIN R. HOSTETTER, *Examiner.*